United States Patent
Nguyen

(10) Patent No.: US 11,774,568 B2
(45) Date of Patent: Oct. 3, 2023

(54) ADD-ON MODULE FOR A DEVICE, SERVER UNIT, LOCALIZATION METHOD, COMPUTER PROGRAM, AND CORRESPONDING STORAGE MEDIUM

(71) Applicant: Siemens Healthcare GmbH, Erlangen (DE)

(72) Inventor: Quoc-Viet Nguyen, Erlangen (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 16/863,248

(22) Filed: Apr. 30, 2020

(65) Prior Publication Data
US 2020/0355812 A1   Nov. 12, 2020

(30) Foreign Application Priority Data
May 6, 2019   (EP) ..................................... 19172744

(51) Int. Cl.
*G01S 11/02*   (2010.01)
*G01R 29/08*   (2006.01)

(52) U.S. Cl.
CPC .......... *G01S 11/02* (2013.01); *G01R 29/0807* (2013.01)

(58) Field of Classification Search
None
See application file for complete search history.

(56) References Cited

U.S. PATENT DOCUMENTS

| 2011/0117924 A1 | 5/2011 | Brunner et al. | |
| 2014/0253383 A1* | 9/2014 | Rowitch | G01S 5/0236 |
| | | | 342/386 |
| 2018/0252535 A1* | 9/2018 | Bhimavarapu | G01R 33/02 |
| 2018/0283882 A1* | 10/2018 | He | H04W 4/024 |

FOREIGN PATENT DOCUMENTS

| CN | 107529222 A | 12/2017 |
| DE | 102005007309 A1 | 2/2006 |
| DE | 102013013156 A1 | 3/2014 |

(Continued)

OTHER PUBLICATIONS

Ibrahim Mai et al: "CNN based Indoor Localization using RSS Time-Series", 2018 IEEE Symposium on Computers and Communications (ISCC), IEEE, Jun. 25, 2018 (Jun. 25, 2018), Seiten 1044-1049, XP033448566.

(Continued)

*Primary Examiner* — Matthew G Marini
(74) *Attorney, Agent, or Firm* — Harness, Dickey & Pierce, P.L.C.

(57) ABSTRACT

An apparatus or an add-on module for a, in particular mobile, device, is disclosed. In an embodiment, the device to be localized or the add-on module uses a measuring unit to measure, via suitable sensors, a local electromagnetic field distribution generated by a given infrastructure. An instantaneous position of the add-on module or of the device equipped therewith is then determined by comparing the measured field distribution with a specified map. In order to facilitate tracking of the add-on module or of the device, the measured field distribution and/or the determined position can be sent via a wireless data connection to a server unit.

24 Claims, 2 Drawing Sheets

(56) References Cited

FOREIGN PATENT DOCUMENTS

DE 102015117280 A1 4/2017
WO WO 2014023429 A1 2/2014

OTHER PUBLICATIONS

European Office Action for European Patent Application No. 19172744.5 dated Nov. 27, 2019.
European Search Report for European Patent Application No. 19172744.5 dated Feb. 5, 2020.
European Office Action dated Aug. 5, 2021 in corresponding European Patent Application No. 19172744.5.

* cited by examiner

ADD-ON MODULE FOR A DEVICE, SERVER UNIT, LOCALIZATION METHOD, COMPUTER PROGRAM, AND CORRESPONDING STORAGE MEDIUM

PRIORITY STATEMENT

The present application hereby claims priority under 35 U.S.C. § 119 to European patent application number EP 19172744.5 filed May 6, 2019, the entire contents of which are hereby incorporated herein by reference.

FIELD

Embodiments of the invention generally relate to an add-on module for a device, in particular a mobile device, to a server unit for communicating with the add-on module or with the mobile device; to a corresponding localization method for localizing the add-on module or the mobile device; to a corresponding computer program or computer program product, which implements the localization method; and to a corresponding computer-readable storage medium.

BACKGROUND

Localization, i.e. the locating or position-fixing, of devices, materials and people is a useful functionality in many different areas of use. Various techniques have been used for this purpose until now. Known examples are satellite-based positioning systems (GPS, GLONASS, etc.) or active locating by way of radar or by communication between a positioning system and a device to be located, for instance by reading RFID tags of passing devices at a checkpoint.

SUMMARY

The inventors have discovered that these solutions may have the disadvantage, however, that they do not work reliably depending on prevailing local signal reception conditions, for instance inside buildings, and/or require that the positioning system and all the devices to be located have a standardized electronic infrastructure, so for example require the use of specified communication standards, communication frequencies and communication protocols. This can limit the versatility of the particular solution.

The inventors have further discovered that it may be considered another disadvantage of conventional solutions that the signals used could affect or interfere with sensitive devices or equipment, or that the localization method cannot be used in accordingly emission-sensitive zones.

At least one embodiment of the present invention allows localization of devices in buildings and sensitive zones. The claims, the description and the figures define advantageous embodiments and developments of the present invention.

An add-on module according to an embodiment of the invention is designed for integration in an existing, in particular mobile, device, in order to equip this device with a localization functionality. The add-on module therefore makes it possible, if applicable in conjunction with the associated device, to locate the add-on module or the device equipped with the add-on module.

In an advantageous embodiment of the present invention, the add-on module according to an embodiment of the invention is implemented in hardware and comprises a connection interface, by which the add-on module can be connected physically to the associated device via a corresponding device-based interface. The add-on module can be configured here to draw electrical power for its operation from the associated device, to communicate with the device and/or to access units, components or resources of the associated device, in each case via the connection interface. Hence, for example, the sensors may be part of the add-on module or part of the associated device, and in the latter case may then be controlled or read by the add-on module. Thus depending on the embodiment of the connection interface or of the associated device, a number of different advantages can result from the fact that the add-on module can be connected according to the invention to the associated device via the connection interface. For example, the add-on module may have, if applicable, a particularly simple and compact construction because it need not necessarily have a dedicated power supply and/or, for instance, can use or take advantage of processing resources, the sensors and/or a communication unit of the associated device.

In an advantageous alternative embodiment of the present invention, the add-on module of an embodiment is implemented in software, so for instance implemented as a computer program or computer program product. The measuring unit and the localization unit are then function blocks of the software, i.e. software modules, software components, subprograms or subroutines, or suchlike. The add-on module is then configured to send to the associated device appropriate control instructions for measuring the field distribution and for determining and sending the position, or for sending the measured field distribution, which instructions bring this about using the units or resources of the device.

In a further advantageous embodiment of the present invention, the add-on module is configured, in order to assist the localization, automatically to cause the add-on module or the associated mobile device to emit at least one ping or ping signal in its area and to detect response signals or echoes, which are received by the add-on module or the associated device from in particular stationary, components or devices of the field-generating infrastructure. In addition, the add-on module is then configured to perform automatically a transit-time analysis based on the response signals and/or the times at which they were detected, and to determine the position of the add-on module on the basis of a result of the transit-time analysis and the specified map. Additionally or alternatively, the add-on module is configured to send to the server unit the response signals, the times at which they were detected, and/or the result of the transit-time analysis. By way of the transit-time analysis, i.e. by determining a time length between emitting the ping signal and receiving the corresponding response signals, it is possible to deduce a distance of the add-on module or of the associated mobile device from the components or devices of the infrastructure that are sending, or have sent, the response signals. Additionally or alternatively, the response signals can identify the particular emitting component of the infrastructure.

Another advantageous embodiment is directed to an apparatus for integrating to an existing device to equip the device with a localization functionality, comprising:

at least one processor configured to passively measure, via at least one sensor, a local electromagnetic field distribution generated by a surrounding infrastructure, without any data being exchanged with the infrastructure, and configured to at least one of determine an instantaneous spatial position of the apparatus by comparing the local electromagnetic field distribution measured with a specified map defining at least one of a spatially resolved reference field distribution and positions of the local electromagnetic field-generating infrastructure, and to facilitate tracking of the apparatus, send at least one of the local electromagnetic field distribution measured and the instantaneous spatial position of the apparatus determined, via a wireless data connection to a server.

The apparatus of such an embodiment may further include a connection interface, by which the apparatus is physically connectable to the device via a corresponding device-based interface.

Another aspect of at least one embodiment of the present invention is a server unit comprising a communication module and a data storage medium and also a processor connected to each, i.e. to the communication module and to the data storage medium. The server unit according to at least one embodiment of the invention is configured here to receive via the communication module from devices, in particular mobile devices, measurement data that in each case indicates a locally measured electromagnetic field distribution, to compare this measurement data automatically with a specified map stored in the data storage medium, and thereby to determine the position at which each device has measured the associated received field distribution.

Another aspect of at least one embodiment of the present invention is a server, comprising:

a communication module;

a data storage medium to store a specified map, defining at least one of a spatially resolved reference field distribution and positions of a field-generating infrastructure; and a processor, connected to the communication module and the data storage medium, wherein the server is configured to receive from each respective device of a plurality of devices, via the communication module, respective measurement data indicating an electromagnetic field distribution measured locally at a location of each of the communication module and the data storage medium, to compare the respective measurement data, automatically, with the specified map stored in the data storage medium, and to determine a respective position, at which each respective device has measured the respective measurement data indicating an electromagnetic field distribution, and to store or update the respective position determined, associated with each respective device, in a corresponding position database stored in the data storage medium Another embodiment of the present invention is a system composed of the server unit according to at least one embodiment of the invention and at least one add-on module according to at least one embodiment of the invention, preferably a multiplicity of add-on modules according to the invention. The server unit and the add-on modules can be adapted, preferably in software, to match each other, so for instance be configured to communicate with one another via a specified communication protocol.

Another embodiment of the present invention is a method for localizing at least one device which is equipped with an add-on module according to at least one embodiment of the invention. A method step of the method according to at least one embodiment of the invention comprises mapping an electromagnetic reference field distribution and/or a field-emitting or field-generating stationary infrastructure in a monitoring region in which the at least one mobile device is meant to be localized. For this purpose, for example, corresponding field values of the electromagnetic field distribution can be measured in a spatially resolved manner for the reference field distribution, in which process, the positions at which each of the field values are measured are therefore recorded, and are assigned the field values measured there.

Another embodiment of the present invention is a method for localizing at least one device (such as a device of at least one embodiment, for example), equipped with an add-on module, comprising:

mapping at least one of an electromagnetic reference field distribution and a field-emitting stationary infrastructure in a monitoring region, in which the at least one device is meant to be localized, to create a map;

measuring a local field distribution via the at least one device to be located upon the at least one device being in a monitoring region; and automatically localizing the at least one device by comparing the local field distribution measured with the map via the at least one of the at least one device and a server, to which the at least one device has transferred the local field distribution measured.

Another embodiment of the present invention is a computer program or computer program product, which comprises commands that on execution of the computer program by the server unit according to at least one embodiment of the invention and by the add-on module according to the invention or the associated device equipped therewith, cause the method according to at least one embodiment of the invention to be performed. In other words, the computer program according to at least one embodiment of the invention can hence be executed by the system according to at least one embodiment of the invention in order to cause the method according to at least one embodiment of the invention to be performed.

Another embodiment of the present invention is a computer-readable storage medium, i.e. a computer-readable data storage medium, on which is stored the computer program or computer program product according to at least one embodiment of the invention.

Another embodiment of the present invention is a memory storing a computer program, including commands which, upon execution of the computer program, cause the method of of an embodiment to be performed.

Another embodiment of the present invention is a non-transitory computer-readable storage medium storing a computer program, including commands which, upon execution of the computer program, cause the method of of an embodiment to be performed.

In order to execute the computer program according to at least one embodiment of the invention, i.e. a corresponding program code, the system according to at least one embodiment of the invention, the server unit according to at least one embodiment of the invention, and/or the add-on module according to at least one embodiment of the invention can each comprise a corresponding processor and an associated corresponding computer-readable storage medium, which is connected to the associated processor. The processor may be, for example, a microchip or microprocessor, an integrated circuit or hardware circuit, or part of a controller, or suchlike.

BRIEF DESCRIPTION OF THE DRAWINGS

Further features, details and advantages of the present invention are presented in the following description of preferred example embodiments and with reference to the drawings, in which.

Figure 1:
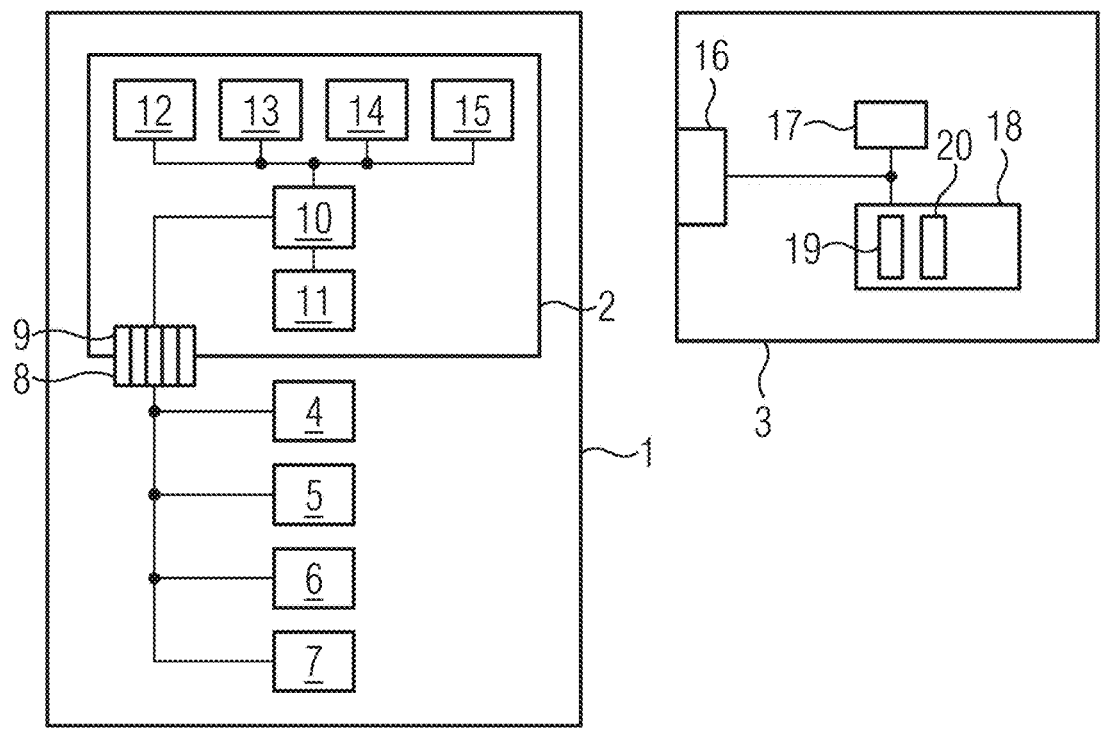
FIG. 1 shows a schematic overview of a system composed of a mobile device and an external server, the mobile device comprising an add-on module for localization.

The example embodiments explained below are preferred embodiments of the invention. In the example embodiments, the described components of the embodiments each constitute separate features of the invention to be considered independently of one another, which develop the invention in each case also independently of one another and hence can also be considered to be part of the invention individually or in a different combination from that shown. In addition, further features of the invention that have already been described can also be added to the described embodiments.

The same reference signs denote identical, similar, functionally equivalent or corresponding elements in each of the figures.

DETAILED DESCRIPTION OF THE EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

An add-on module according to an embodiment of the invention is designed for integration in an existing, in particular mobile, device, in order to equip this device with a localization functionality. The add-on module therefore makes it possible, if applicable in conjunction with the associated device, to locate the add-on module or the device equipped with the add-on module.

Integration in this sense may mean or include, for instance, connecting the add-on module to the mobile device via a port, an interface, an electrical connection or a data connection. The add-on module can then exchange data or signals with the associated device or access resources of the device via the connection interface. It is equally possible for the add-on module to be designed as an autonomous unit, in which case the integration of the add-on module in the associated device can then mean, for example, solely a mechanical connection of the add-on module to the mobile device.

Thus within the meaning of embodiments of the present invention, the device may be an electrical or electronic device that has dedicated electrical and/or electronic units. Within the meaning of embodiments of the present invention, however, the device may equally be a non-electronic device, a tool, goods in transit, a component, a trolley, a patient couch, an item of clothing, in particular worn by a person, and/or suchlike.

The add-on module according to an embodiment of the invention comprises a measuring unit and a localization unit. The measuring unit is configured to measure passively, via sensors, a local electromagnetic field distribution generated by a given surrounding infrastructure, without any data being exchanged with this infrastructure. Measuring the field distribution may mean or include, for example, measuring or determining a local field strength, a field gradient, an energy and/or frequency spectrum of local electromagnetic fields or radiation, the polarization thereof, and/or suchlike.

The localization unit is configured to determine automatically an instantaneous spatial position of the add-on module by comparing the measured field distribution with a specified map that defines a spatially resolved reference field distribution and/or positions of the field-generating infrastructure. In order to facilitate tracking of the add-on module, or of the associated device equipped with the add-on module, the localization unit is also configured to send the measured field distribution and/or the determined position via a wireless data connection to an external server unit, so for instance to a server, a Cloud server, a computing center, or suchlike. In the former case, the server unit can then analyze the measured field distribution, for instance by comparing the measured field distribution with the specified map, in order to localize the add-on module or the associated mobile device.

The specified map may be a building plan, for example, in which are incorporated the positions of the field-generating infrastructure. Additionally or alternatively, the reference field distribution can be incorporated therein, for instance as a heat map or in accordance with a topological map, where, for example, lines or uniformly denoted regions can define identical field distributions or identical values of parameters of the field distribution.

The reference field distribution can be determined by a preparatory measurement, for example, and then specified, i.e. provided, to a manufacturer of the add-on module or to an operator of the server unit, for instance. Particularly advantageously, a given user of the add-on module can download the reference field distribution onto this add-on module. The add-on module according to the invention can hence advantageously be adapted in a particularly simple and versatile manner to different deployment zones, for instance to different building complexes and/or to a change in the relevant field-generating infrastructure. The field-generating infrastructure may comprise in particular stationary devices or apparatuses that emit electromagnetic fields or radiation. These may be, for example, routers, repeaters or access points of a WLAN network infrastructure, electronic devices equipped with radio units, for instance devices such as, in particular permanently installed, television sets, drink dispensers, coffee machines, smoke alarms, production machines, manufacturing equipment, control or monitoring systems, medical devices, and/or suchlike.

Such devices and apparatuses, i.e. the field-generating infrastructure, generate a distinct electromagnetic field distribution according to the relative positions and the nature and type of the devices and apparatuses forming the field-generating infrastructure. The present invention therefore proposes in particular using the measured field distribution as the basis for passive position-fixing on the part of the device to be located. This means that the device to be located need not necessarily itself actively transmit or communicate, for instance, with an external positioning unit. This has the advantage, therefore, that there is no need for communication, i.e. for signal or data transfer, to take place between the field-generating infrastructure and the add-on module or device currently to be localized, and equally there is no need to install dedicated infrastructure for determining the position of the device. Therefore there is advantageously also no need for the add-on module or the associated mobile device to be adapted to, or harmonized with, the relevant field-generating infrastructure or registered with the infrastructure.

In addition, the localization or tracking can also be employed in emission-sensitive zones, i.e. signal-sensitive or radio-sensitive zones, because the add-on module or the associated mobile device need not itself emit any radio signals or radiation or such like at all for the localization. Examples of zones that have such sensitivity may be an intensive care unit or radiology department in a hospital, where currently it is common practice to instruct that mobile electronic devices must be switched off or switched into a passive operating mode (flight mode).

Since in the present case, however, active field emissions, namely the electromagnetic field distribution produced or emitted by the existing field-generating infrastructure, are nonetheless still used for the localization, the present invention can be used to exploit the advantages of active and of passive position-fixing while avoiding the disadvantages associated with each. Thus, for example, by way of at least one embodiment of the present invention, in contrast with conventional solutions, there is typically no need for direct line-of-sight between the infrastructure and the add-on module or the associated mobile device, or between the module or device and a position marker or a camera or suchlike provided for optical tracking.

Since the field distribution is produced by normal operation of the infrastructure unrelated to the localization functionality, and there is no need to provide or establish this infrastructure specifically for the localization functionality, the present invention advantageously makes localization possible in a particularly efficient manner in terms of effort, cost and energy.

Since the field-generating infrastructure typically lies inside a building, for instance inside the aforementioned hospital, an office building or factory building, or suchlike, the field distribution is produced directly inside this building and hence is not shielded by the building. Hence the present invention advantageously allows reliable and energy-efficient localization even inside buildings, for example because there is no need to receive or measure signals originating from outside the building concerned. Thus the present invention is suitable especially for indoor position-finding.

Particularly preferably, the given local field distribution can be measured repeatedly in succession, or a variation in the field distribution over time can be measured. This can advantageously facilitate identification and elimination, i.e. arithmetic removal, of time-varying factors causing interference, for instance moving field-sources such as mobile devices of other people in the vicinity, and the effect thereof on the measured field distribution. This can improve the accuracy and reliability of the reference field distribution and ultimately for localizing the add-on module or the associated device equipped with the add-on module.

Since the present position of the add-on module or of the associated device equipped therewith has been determined, this position can be provided by the add-on module or by the device and/or by the server unit. Hence the instantaneous position of the add-on module or of the device can be retrieved or accessed at any time, which can yield many different advantages depending on a given field of use. It is hence possible, for example, to avoid waits or delays that may have arisen in the past, for instance when a certain component or tool or device is needed for a subsequent task but needs to be found first. Especially in a medical setting, in particular in hospitals, such delays may have life-threatening consequences, which can be avoided or mitigated by the present invention.

In an advantageous embodiment of the present invention, the add-on module according to an embodiment of the invention is implemented in hardware and comprises a connection interface, by which the add-on module can be connected physically to the associated device via a corresponding device-based interface. The add-on module can be configured here to draw electrical power for its operation from the associated device, to communicate with the device and/or to access units, components or resources of the associated device, in each case via the connection interface. Hence, for example, the sensors may be part of the add-on module or part of the associated device, and in the latter case may then be controlled or read by the add-on module. Thus depending on the embodiment of the connection interface or of the associated device, a number of different advantages can result from the fact that the add-on module can be connected according to the invention to the associated device via the connection interface. For example, the add-on module may have, if applicable, a particularly simple and compact construction because it need not necessarily have a dedicated power supply and/or, for instance, can use or take advantage of processing resources, the sensors and/or a communication unit of the associated device.

Since the connection interface can be standardized, the add-on module can also be mass produced advantageously particularly easily and can be used for different devices in a particularly simple and versatile manner. Hence, for example, existing mobile devices can be retrofitted particularly easily with the add-on module. For example, the connection interface may be embodied as a USB, Thunderbolt or HDMI port, as part of an RJ plug-in connection, as a serial interface, or suchlike.

The same is still true if the add-on module additionally or alternatively has an autonomous design, i.e. can itself include or comprise all the components or units needed for the localization functionality. Thus the add-on module can comprise, for example, a dedicated power supply, dedicated sensors for measuring the field distribution, a dedicated communication unit for sending data to the server unit, a dedicated control device comprising a processor and a data storage medium and an operating program, and/or suchlike. This can advantageously allow particularly versatile use of the add-on module even when the associated mobile device does not have a matching device-based interface. It may even be possible in this case, if applicable, to dispense with the connection interface of the add-on module, allowing the add-on module to be designed to be waterproof and/or dust-proof, for instance, particularly easily.

The add-on module can be configured particularly advantageously, however, to prioritize using resources of the device that are available or accessible via the connection interface in preference to using dedicated units or resources of the add-on module that may be present, in particular when the device-based resources, i.e. resources accessible via the connection interface, are more powerful than the resources or units of the add-on module.

In an advantageous alternative embodiment of the present invention, the add-on module of an embodiment is implemented in software, so for instance implemented as a computer program or computer program product. The measuring unit and the localization unit are then function blocks of the software, i.e. software modules, software components, subprograms or subroutines, or suchlike. The add-on module is then configured to send to the associated device appropriate control instructions for measuring the field distribution and for determining and sending the position, or for sending the measured field distribution, which instructions bring this about using the units or resources of the device.

In other words, the add-on module according to an embodiment of the invention, so here as additional software, can be downloaded to a data storage medium of the associated device that is to be equipped with the localization functionality in the form of the add-on module. The add-on module then makes full use of existing hardware of the associated device. The solution proposed here advantageously allows the add-on module according to the invention to be deployed with particularly low cost and little effort, for instance because a multiplicity of corresponding add-on modules can be downloaded simultaneously to a multiplicity of devices in an automated manner.

In addition, the implementation of the add-on module according to an embodiment of the invention in software allows particularly simple and versatile adaptability of the add-on module. Thus the add-on module can be updated and further improved particularly easily even when it is already deployed or in use. Another advantage of implementing the add-on module in software is that, if applicable, an existing data storage medium of the associated device can be used for storing the add-on module, and therefore advantageously no additional installation space is needed for the add-on module in the device.

A combination in which the add-on module according to an embodiment of the invention is implemented partially in hardware and partially in software is equally possible.

In a further advantageous embodiment of the present invention, the add-on module is configured, in order to assist the localization, automatically to cause the add-on module or the associated mobile device to emit at least one ping or ping signal in its area and to detect response signals or echoes, which are received by the add-on module or the associated device from in particular stationary, components or devices of the field-generating infrastructure. In addition, the add-on module is then configured to perform automatically a transit-time analysis based on the response signals and/or the times at which they were detected, and to determine the position of the add-on module on the basis of a result of the transit-time analysis and the specified map. Additionally or alternatively, the add-on module is configured to send to the server unit the response signals, the times at which they were detected, and/or the result of the transit-time analysis. By way of the transit-time analysis, i.e. by determining a time length between emitting the ping signal and receiving the corresponding response signals, it is possible to deduce a distance of the add-on module or of the associated mobile device from the components or devices of the infrastructure that are sending, or have sent, the response signals. Additionally or alternatively, the response signals can identify the particular emitting component of the infrastructure.

In other words, although in this case a signal exchange takes place between the add-on module or the device at one end and the infrastructure at the other, this signal exchange is minimal in terms of data transfer and the demands the data transfer places on the infrastructure, on communication protocols or communication methods used, and suchlike.

In general, a multiplicity of devices, and software implemented therein, can perform the ping technique provided here and hence can interpret the ping signal without any particular measures. Therefore the requirements for deploying the add-on module according to the invention in the embodiment proposed here continue to be so limited that it is possible to use the add-on module in a multiplicity of different environments, in which different devices, software and communication methods are employed, in a versatile manner in order to assist the localization, so for instance to improve the localization in terms of the accuracy or reliability thereof. In particular a second localization methodology that can improve the accuracy of the position-finding and/or verify or check the plausibility of the localization based on the measured field distribution is advantageous.

In another advantageous embodiment of the present invention, the add-on module is configured additionally to analyze and/or transfer to the server unit a signal from a satellite-based positioning system (GPS, GLONASS, Galileo, etc.) for determining the position. In other words, the add-on module can thus comprise a receiver for signals from the satellite-based positioning system, or read or retrieve data from such a receiver of the associated mobile device. As described in the introduction, the accuracy of position-finding based on a satellite-based positioning system may be reduced in particular inside buildings. The present embodiment of the present invention, however, is based on the knowledge that an advantage can still be gained by additionally using the signal from the satellite-based positioning system. For instance, the particular building or a particular building wing in which the add-on module or the associated device is currently situated can be identified, for example, on the basis of the satellite signal, so for instance a GPS, GLONASS or Galileo signal, or a history of the signals. Then for more accurate localization, the measured local electromagnetic field distribution can be analyzed as described. Taking into account the satellite signal, reliability can be improved or a plausibility check of the position-finding or position-fixing can be achieved, for example because, in the event of identical local values of the reference field distribution at different locations in different building wings or different buildings, the actual position of the add-on module or of the associated device can be isolated on the basis of the satellite signal.

In another advantageous embodiment of the present invention, the add-on module is configured to ascertain from the measured field distribution and/or from its own determined position, whether it is in an emission-sensitive zone, and if, and as long as, this is the case, to prevent or delay any sending of signals by the add-on module and/or the associated device equipped with the add-on module. For example, sending the aforementioned data to the server unit, or the described emission of the ping signal can be deferred until it is identified from the measured field distribution and/or from the located position that the add-on module is no longer located in the, or an, emission-sensitive zone.

As already described, such emission-sensitive zones may be, for example, an intensive care unit or a radiology department in a hospital, or suchlike. It can be equally advantageous also in an industrial environment or, for instance, within range of measurement instruments, radio telescopes and/or suchlike, to delay or defer the sending of signals.

Relevant emission-sensitive zones can be defined or saved, for instance, in the specified map or in a separate table or database. Additionally or alternatively, the add-on module itself can identify an emission-sensitive zone, if applicable, from the measured field distribution, for example. This can be done by storing, for example, relevant specified parameter values for the field distribution, for instance in a data storage medium of the add-on module, which parameter values indicate an emission-sensitive zone or can be interpreted accordingly. An example of such a parameter value or a corresponding field distribution in an emission-sensitive zone may be a threshold value for a magnetic field strength, for instance. A magnetic field strength lying above the specified threshold value may exist, for example, in an area around a magnetic resonance imaging machine.

Another aspect of at least one embodiment of the present invention is a server unit comprising a communication module and a data storage medium and also a processor connected to each, i.e. to the communication module and to the data storage medium. The server unit according to at least one embodiment of the invention is configured here to receive via the communication module from devices, in particular mobile devices, measurement data that in each case indicates a locally measured electromagnetic field distribution, to compare this measurement data automatically with a specified map stored in the data storage medium, and thereby to determine the position at which each device has measured the associated received field distribution.

The specified map, as already described in relation to the add-on module according to at least one embodiment of the invention, defines a spatially resolved reference field distribution and/or positions of a field-generating, in particular stationary, infrastructure.

The server unit of at least one embodiment is also configured to store or update the determined position associated with each device in a corresponding position database, which is stored or held in the data storage medium. The server unit according to at least one embodiment of the invention may thus be in particular the server unit mentioned in relation to the add-on module according to at least one embodiment of the invention, and may correspondingly have the attributes or features mentioned or described there. The server unit according to at least one embodiment of the invention may hence be, for example, a server, a Cloud server, a computing center, or suchlike, and, if applicable, may comprise or include additional components or parts, for instance additional interfaces, data lines, a power supply, and/or suchlike.

The server unit according to at least one embodiment of the invention can provide the position database, for example, to external devices or for suitable retrievals, in order that the positions of all the devices entered in the position database can be provided by the server unit according to at least one embodiment of the invention or can be retrieved from the server unit according to the invention.

Another embodiment of the present invention is a system composed of the server unit according to at least one embodiment of the invention and at least one add-on module according to at least one embodiment of the invention, preferably a multiplicity of add-on modules according to the invention. The server unit and the add-on modules can be adapted, preferably in software, to match each other, so for instance be configured to communicate with one another via a specified communication protocol.

Another embodiment of the present invention is a method for localizing at least one device which is equipped with an add-on module according to at least one embodiment of the invention. A method step of the method according to at least one embodiment of the invention comprises mapping an electromagnetic reference field distribution and/or a field-emitting or field-generating stationary infrastructure in a monitoring region in which the at least one mobile device is meant to be localized. For this purpose, for example, corresponding field values of the electromagnetic field distribution can be measured in a spatially resolved manner for the reference field distribution, in which process, the positions at which each of the field values are measured are therefore recorded, and are assigned the field values measured there.

Equally, for example, a computer-aided simulation of a field propagation or field distribution can be performed on the basis of the positions of the infrastructure in order to determine the reference field distribution as an expected field distribution in the monitoring region.

A further method step of the method according to at least one embodiment of the invention comprises measuring a local field distribution via the device to be located while, or if, this device is in the monitoring region. A further method step of the method according to at least one embodiment of the invention comprises automatically localizing the mobile device by comparing the measured local field distribution with the map, i.e. with the reference field distribution and/or the positions of the infrastructure, via the associated mobile device itself and/or via the server unit according to the invention, to which the device has transferred the measured field distribution, if applicable.

In other words, the method according to at least one embodiment of the invention may be a method for operating the system according to at least one embodiment of the invention, the server unit according to at least one embodiment of the invention and/or the add-on module according to at least one embodiment of the invention.

The method according to at least one embodiment of the invention can accordingly comprise as additional method steps, which may be optional, additional measures, processes or procedures described in connection with the other embodiments of the present invention.

In an advantageous embodiment of the method according to the invention, in order to produce the map of the reference field distribution, a specified field propagation model is used to simulate this map. For this purpose, the field propagation model is provided with positions, device types and operating profiles of field-emitting components or devices of the stationary infrastructure as input data. The field propagation model may thus be a mathematical/physical model that simulates propagation of electromagnetic waves, fields or radiation in a spatial region and/or an expected resultant overall field distribution, i.e. precisely the reference field distribution, that results or arises from the interaction or superposition of the components of the infrastructure or of the separate fields emitted thereby. In particular, the field propagation model can be provided additionally with a shape or architecture of the monitoring region, for instance in the form of a building plan or suchlike, as part of the input data. The operating profiles of the field-emitting components can define, for example, the operating state thereof, operating times thereof, or a power, in particular a time-dependent power, at which the individual components or devices are operated. This can advantageously contribute to a particularly accurate and reliable simulation of the reference field distribution.

In another advantageous embodiment of the present invention, for the reference field distribution and the local field distribution, a field strength is measured in a frequency-resolved manner for each of a plurality of frequency ranges specified for different communication methods. In other words, a measurement is thus made, for instance, of which individual field strengths exist in different frequency ranges or frequency bands and contribute to the particular overall field distribution. It is thus possible to measure, for example, which field strengths or field distribution components are being produced by mobile communications, WLAN signals, low-energy communication, Bluetooth, infrared, radio communication, and/or suchlike. This can advantageously contribute to improved accuracy of the localization, for example because different regions or positions in which nominally, or in the integrated view, the same field strength exists, can be distinguished from one another on the basis of differences in the currently existing separation or distribution of the field strength, or of a corresponding field energy, into different frequency ranges.

In another advantageous embodiment of the present invention, in order to produce the map of the reference field distribution, a variation in the electromagnetic field distribution over time in the monitoring region is measured over at least a specified time period, preferably over at least one day or at least one week. The field distribution can be measured continuously, or a multiplicity of individual measurement points can be recorded successively during the specified time period. The specified time period may here depend on the monitoring region or on an activity that takes place regularly in the monitoring region.

For instance, if an activity or an operation in the monitoring region, in particular of the infrastructure of the monitoring region, follows a regular or periodic pattern, then the specified time period can preferably equal at least one corresponding period length. For example, in many operations and apparatuses, such a period is given by a day, because the operation, and hence also, if applicable, the field distribution, changes over the day, but this change is repeated at least substantially every day.

By measuring the variation in the field distribution over time and producing the map of the reference field distribution on the basis of this variation over time, then time-related, in particular periodic, changes in the field distribution in the monitoring region can be detected and taken into account in the localization of the particular mobile device. In particular it is hence possible to improve the accuracy and reliability for the localization.

The entire variation over time can be incorporated in the map. Equally, for example, selected individual values, or individual values calculated from the variation over time, for different times or time intervals of the specified time period can be incorporated in the map. For instance, maximum and minimum values, average values for different portions or intervals of the specified time period and/or suchlike can be incorporated in the map. For this purpose, for example, the specified time period can be divided into a plurality of intervals of specified time length; for instance a day can be divided into working hours and non-working hours, or, for example, into intervals of length one hour or two hours or three hours, or suchlike, or a specified time period of one week can be divided into intervals of length 12 hours or 24 hours. It is hence advantageously possible to reduce a data volume of the map while still taking into account the variation in the field distribution over time.

In an advantageous development of at least one embodiment of the present invention, the measured variation over time is provided as an input, i.e. as input data, to a specified machine learning component, in particular to a deep-learning based artificial neural network. This machine learning component is trained in this case to optimize the reference field distribution by reducing noise in the variation over time, which noise is caused by time-varying signal or field sources that do not belong to the stationary infrastructure. This can advantageously reduce the accuracy and reliability for localizing the device and, if applicable, a complexity of the localization, for instance the comparison of the measured field distribution with the reference field distribution.

As training data for the machine learning component can be used, for example, a field distribution unaffected by external sources, and also various measured variations in field distributions over time, which have been measured under the influence of one or more sources moving, preferably in various ways, through the monitoring region. The trained machine learning component can then deliver on the basis of the particular input a cleaned or optimized reference field distribution as the output, i.e. as the output data.

Another embodiment of the present invention is a computer program or computer program product, which comprises commands that on execution of the computer program by the server unit according to at least one embodiment of the invention and by the add-on module according to the invention or the associated device equipped therewith, cause the method according to at least one embodiment of the invention to be performed. In other words, the computer program according to at least one embodiment of the invention can hence be executed by the system according to at least one embodiment of the invention in order to cause the method according to at least one embodiment of the invention to be performed.

Another embodiment of the present invention is a computer-readable storage medium, i.e. a computer-readable data storage medium, on which is stored the computer program or computer program product according to at least one embodiment of the invention.

In order to execute the computer program according to at least one embodiment of the invention, i.e. a corresponding program code, the system according to at least one embodiment of the invention, the server unit according to at least one embodiment of the invention, and/or the add-on module according to at least one embodiment of the invention can each comprise a corresponding processor and an associated corresponding computer-readable storage medium, which is connected to the associated processor. The processor may be, for example, a microchip or microprocessor, an integrated circuit or hardware circuit, or part of a controller, or suchlike.

The attributes and developments given above and below relating to the add-on module according to at least one embodiment of the invention, to the server unit according to at least one embodiment of the invention, to the method according to the invention, to the computer program according to at least one embodiment of the invention, and to the computer-readable storage medium according to at least one embodiment of the invention, and the corresponding advantages are each mutually transferable, mutatis mutandis, between these aspects of the present invention. Thus at least one embodiment of the invention includes also those developments of the aspects of the present invention that comprise embodiments which, to avoid unnecessary redundancy, are not described here explicitly in each combination or not described separately for each embodiment of the present invention.

FIG. 1 shows a schematic overview of a system composed of a mobile device 1, which in the present case is equipped with an add-on module 2 for providing a localization functionality for the mobile device 1, and of an external server 3.

Until now, localizing or locating, and if applicable tracking, devices, goods, apparatuses and/or people, in particular if these are mobile and therefore at any point in time may not be located at positions known a priori, required, especially indoors or in closed environments, a problematically high use of time and resources, and may have required, for example, a dedicated infrastructure composed of active devices communicating solely by way of a specified communication method and a specified communication protocol.

These problems and challenges shall be addressed here. To this end, the device 1 comprises in the present case a device processor 4 and a memory module 5, i.e. a data processing unit, and also a communication module 6 and a GPS module 7. These modules or units are connected to one another and to a module interface 8 of the device 1, to which interface the add-on module 2 is connected in the present case.

The add-on module 2 accordingly itself comprises a connection interface 9 for connecting the add-on module 2 to the device 1. In addition in the present case, the add-on module 2 comprises a processor 10 and a data storage medium 11 connected thereto. Additional units of the add-on module 2, here including a measuring unit 12, a localization unit 13, a communication unit 14 and a GPS receiver 15, are likewise connected to the processor 10.

At least some modules, units or components are therefore present redundantly by way of example both in the device 1 and in the add-on module 2. This represents one possible implementation, although at least some redundancies can be removed from the add-on module 2 and/or from the device 1 for an alternative, particularly economical embodiment.

In the present case, the server 3 is an external unit, and therefore communication between the device 1 or the add-on module 2 at one end and the server 3 at the other takes place via a wireless data connection. For this purpose, the server 3 in this case comprises a server communication interface 16 and, connected thereto, a server processor 17 and a memory unit 18. In this example, a device database 19 and a position database 20 are stored in the memory unit 18. In the device database 19 are registered or identified a multiplicity of electronic apparatuses, for instance the device 1 and/or the add-on module 2. In the position database 20 are stored, if known, specific positions of the apparatuses or devices identified in the device database 19.

Figure 2:
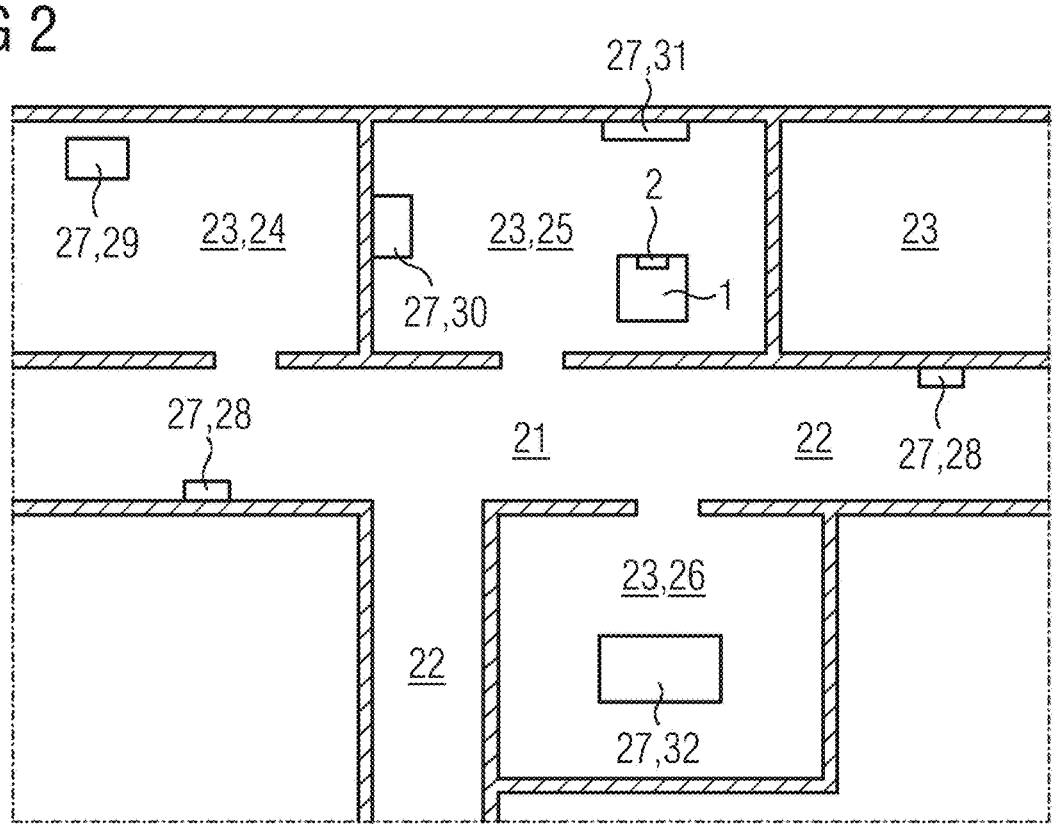
FIG. 2 shows a schematic plan view of a portion of an interior of a building in which the device of FIG. 1 is meant to be localized via its add-on module.

The device 1 can be localized even indoors or in buildings using the system shown schematically in FIG. 1. FIG. 2 shows as such an environment by way of example a schematic plan view of a portion of an interior of a building in which the device 1 is meant to localized. Thus since the position of the device 1 is meant to be found or monitored in the interior or building shown, the interior shown here is also referred to as a monitoring region 21. The monitoring region 21 in the present case comprises a plurality of corridors 22, from which a plurality of rooms 23 can be reached. In the present case, the rooms 23 comprise by way of example, inter alia, an equipment room 24, a common room 25, and an examination room 26.

Distributed around the monitoring region 21 is an infrastructure 27 composed of permanently installed devices, which produce an electromagnetic field distribution in the monitoring region 21. Shown here by way of example as part of the infrastructure 27 are a plurality of access points 28 (WLAN access points), a printer 29, a drink dispenser 30, a television set 31, and a magnetic resonance imaging machine, abbreviated here to MRI machine 32.

Figure 3:
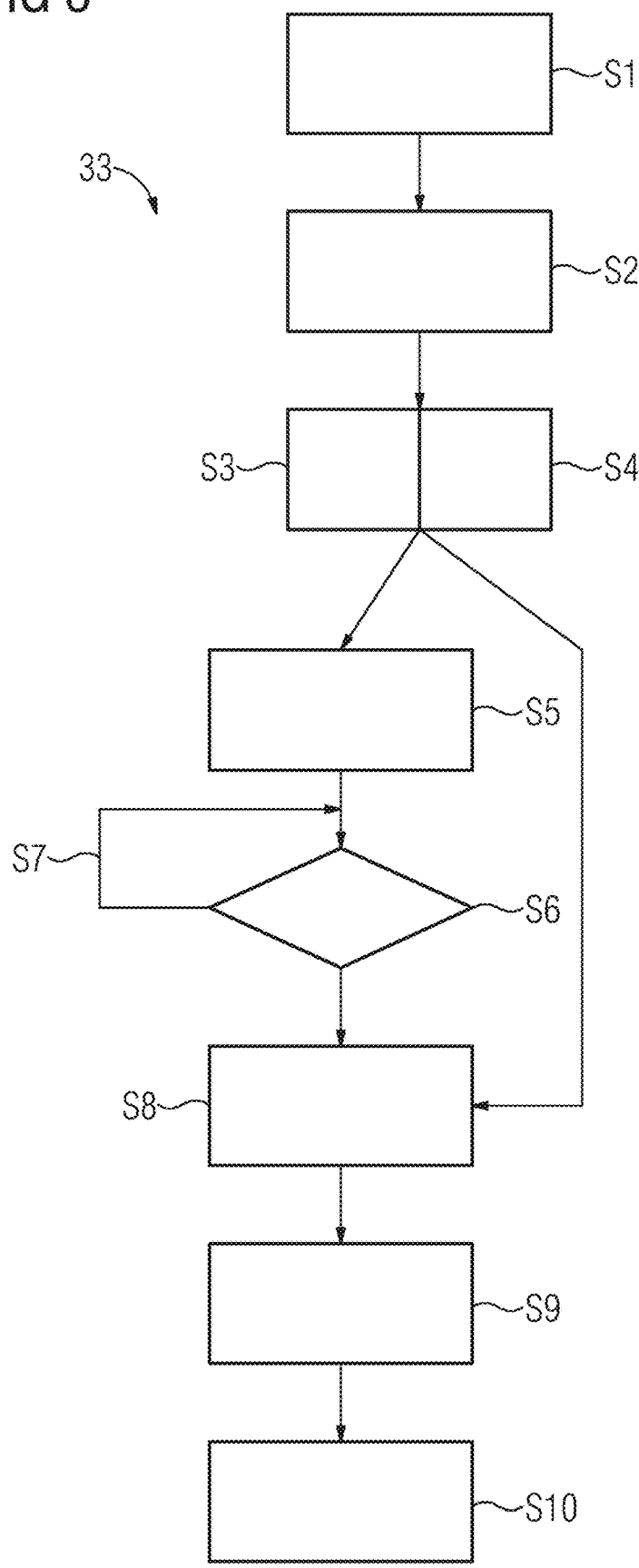
FIG. 3 shows a schematic flow diagram by way of example of a method for operating the system of FIG. 1 for localizing the mobile device.

A flow diagram 33 shown by way of example and schematically in FIG. 3 shall be used below to explain, with reference to FIG. 1 and FIG. 2, a method for localizing the device 1 in the monitoring region 21.

In a method step S1, a map of the monitoring region 21 is first created that defines a spatially resolved electromagnetic reference field distribution in the monitoring region 21 and defines the positions of the devices or components of the field-generating infrastructure 27. This may comprise measuring the field distribution, a suitable simulation, AI-based or machine-learning based optimization, and/or suchlike. The thereby created map of the monitoring region 21 is then provided to the server 3 and the add-on module 2.

In a method step S2, the device 1 is equipped with the add-on module 2. Thus in this process the add-on module 2 is integrated into the device 1 and connected to the module interface 8 thereof.

The method steps S1 and S2 can equally be performed in a different order or in parallel with each other.

Once these preparatory steps are finished, the mobile device 1 is meant to be in deployment. The mobile device 1 may be, for example, a cellphone, a portable computer, a mobile medical device, a patient couch, a tool or instrument, or suchlike. It is assumed in the present case that the localization functionality of the device 1, to which the add-on module 2 has been added, is active and that the device 1 is in the monitoring region 21. FIG. 2 shows the device 1 in a position in the common room 25 by way of example.

In a method step S3, the local electromagnetic field distribution is measured at the position of the device 1. This can be performed here via the measuring unit 12 of the add-on module 2 and/or using suitable sensors of the device 1, which sensors can be controlled for this purpose by the add-on module 2, in particular by the measuring unit 12.

In parallel, in a method step S4, the device 1 or the add-on module 2 emits a ping signal, i.e. an echo request, for instance via the communication module 6 or the communication unit 14 respectively. If the device 1 or the add-on module 2 subsequently receives corresponding response signals from one or more devices or components of the infrastructure 27, then a transit-time analysis based thereon is performed, for example by the localization unit 13, for instance using the processor 10 and/or the device processor 4.

In a method step S5, in the present case the position of the device 1 is determined, for instance by the localization unit 13, from the measured local field distribution and, if applicable, taking into account a result of the transit-time analysis. In addition, a signal from the GPS module 7 or from the GPS receiver 15, or a position or localization history that they have determined, can be taken into account, for instance up to a time at which the device 1 enters the monitoring region 21. At the position of the device 1 shown in FIG. 2 by way of example in the common room 25, the local electromagnetic field distribution that exists there may be composed, for example, of signal or field components that are produced by the access points 28, the drink dispenser 30 and the television set 31, but not by the printer 29 or the MRI machine 32. At the position of the device 1, this results in a distinct position-dependent superposition of these field components to produce the local field distribution, so that the position of the device 1 can be determined by a comparison with the specified map.

In a method step S6, the add-on module 2 checks automatically whether the determined position lies within a subregion of the monitoring region 21 that is identified in the map as a signal-sensitive or emission-sensitive subregion. In the present case, for example, the examination room 26 containing the MRI machine 32 may be identified as a sensitive region of this type. If this is the case, i.e. the device 1 lies in a sensitive region, then emission of signals by the add-on module 2 and the device 1 is prevented or delayed automatically until the device 1 is no longer in a sensitive region. This is indicated here by a loop-type method step S7.

As long as the device 1 is not, or no longer, in the, or a, sensitive region, data obtained is sent to the server 3 in a method step S8. This data may include, for example, the measured field distribution, the determined position, the result of the transit-time analysis, signals from the GPS module 7 or from the GPS receiver 15, and/or suchlike. This data can be sent, for instance, via the communication module 6 or the communication unit 14.

As indicated here by an alternative program path, the method steps S5 to S7 can be skipped, i.e. it is possible to omit position-finding by the device 1 or the add-on module 2 itself. The data acquired or obtained in method step S4, so in particular the measured local field distribution, can then be transferred directly to the server 3 in method step S8.

In a method step S9, the server 3 uses the server processor 17 to process the corresponding data sent by the device 1 or the add-on module 2 and received via the server communication interface 16. This can involve different processes or computational steps depending on what data has been sent or received. For instance, the server 3 may itself determine the position of the device 1 from the received data, identify the particular device 1 and/or the particular add-on module 2, check whether this is already incorporated in the device database 19, and/or suchlike. It can be advantageous here for the server 3 to determine the position of the device 1, because the server 3 typically has more computing capacity or computing resources available than the device 1 and the add-on module 2.

In a method step S10, the server 3 updates the position database 20 with the determined position of the device 1 or of the add-on module 2. Since the database 20 is provided to other users, devices or programs by the server 3, the present position of the device 1 or of the add-on module 2 is hence then available, so that this position can be found by querying the position database 20.

Thus in the present case, an environment context, which is in the form of a field distribution and produced by the field-generating infrastructure 27 that is present anyway in the monitoring region 21, is used to localize the device 1, i.e. to determine the position of the device 1, in a particular target environment, so in this case inside the monitoring region 21. The components or devices of the infrastructure 27 can produce the electromagnetic field distribution in the monitoring region 21 by actively emitting fields or signals and/or solely as a result of their normal operation. The components of the infrastructure 27 here form in visual terms a network, which produces, or is spanned by, the field distribution in the monitoring region 21. The relevant position within this network can then be determined by measuring a local characteristic of the field distribution.

Not only the mobile device 1 considered here by way of example, but also the components or devices of the infrastructure 27, may be equipped, or get equipped, with the add-on module 2. It is thereby possible likewise to determine or monitor the positions of the components or devices of the infrastructure 27. This can advantageously facilitate, for instance via the server 3, for example keeping an inventory, implementing anti-theft monitoring, automatic adjustment of the reference field distribution on detecting a change in position of a component of the infrastructure 27, and suchlike.

The add-on module 2 and its functions can each be implemented entirely or partially in hardware or in software. This may depend on the functions that are meant to be realized, on the type and facilities of the particular device 1 or of the particular component of the infrastructure 27, and/or suchlike.

To summarize, an existing electrical or electronic infrastructure 27 can advantageously be used in the described manner for localization purposes, while allowing, in an economical way in terms of components and money, at least parts of the localization functionality to be transferred from the infrastructure 27 to the devices 1, apparatuses or elements to be localized, with the result that the infrastructure 27 does not need to be designed or adapted specifically for the localization purpose. Thus the examples described show how it is possible to facilitate particularly advantageously localization of devices, apparatuses, elements or people in particular in buildings and sensitive regions.

Although the invention has been illustrated and described in greater detail with reference to the referred example embodiments, the invention is not restricted thereby. Other variations and combinations can be derived herefrom by the person skilled in the art without departing from the essential concept of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An add-on module that, when integrated in a device, is configured to equip the device with a localization functionality, the add-on module comprising:
   a measuring unit configured to passively measure a local electromagnetic field distribution generated by an infrastructure without any data being exchanged with the infrastructure; and
   a localization unit configured to determine an instantaneous spatial position of the add-on module by comparing the local electromagnetic field distribution with a specified map, the specified map defining a spatially resolved reference field distribution of a local electromagnetic field-generating infrastructure.

2. The add-on module of claim 1, wherein the add-on module is implemented in hardware and further comprises a connection interface, the add-on module being physically connectable to the device via a connection between the connection interface and a corresponding device-based interface.

3. The add-on module of claim 1, wherein the add-on module is implemented in software stored on a non-transitory computer-readable medium in the device, and the software causes at least one processor of the device to implement the measuring unit and the localization unit when the software is executed by the at least one processor.

4. The add-on module of claim 1, wherein the add-on module is configured to:
   emit at least one ping signal and detect response signals from the infrastructure, or cause the device to emit the at least one ping signal and detect the response signals; and
   perform a transit-time analysis based on at least one of the response signals or times at which the response signals were detected, and
   determine the instantaneous spatial position of the add-on module based on the transit-time analysis and the specified map.

5. The add-on module of claim 1, wherein the add-on module is configured to determine the instantaneous spatial position based on a signal from a satellite-based positioning system.

6. The add-on module of claim 1, wherein the add-on module is configured to:
   determine whether the add-on module is in an emission-sensitive zone based on at least one of the local electromagnetic field distribution or the instantaneous spatial position; and
   delay transmission of a first signal by at least one of the add-on module or the device when the add-on module is in the emission-sensitive zone.

7. The add-on module of claim 1, wherein
   the spatially resolved reference field distribution includes a plurality of reference field distribution values assigned to a plurality of corresponding positions; and
   the localization unit is configured to determine the instantaneous spatial position based on the local electromagnetic field distribution, the plurality of reference field distribution values and the plurality of corresponding positions.

8. The add-on module of claim 1, wherein the measuring unit is configured to passively measure the local electromagnetic field distribution generated by the infrastructure including measuring a field strength and a frequency spectrum such that the local electromagnetic field distribution is frequency-resolved.

9. A server, comprising:
   a communication module;
   a data storage medium to store a specified map and a position database, the specified map defining a spatially resolved reference field distribution of a field-generating infrastructure; and
   at least one processor, connected to the communication module and the data storage medium, the at least one processor being configured to,
      obtain, via the communication module, respective measurement data from each respective device among a plurality of devices, the respective measurement data indicating an electromagnetic field distribution measured locally at the respective device,
      compare the respective measurement data with the specified map to determine a respective position at which the respective device measured the respective measurement data, and
      store or update the respective position in the position database.

10. A method for localizing at least one device equipped with an add-on module, the method comprising:
   creating a map by mapping a reference field distribution of a field-emitting stationary infrastructure in a monitoring region;
   measuring a local field distribution via the at least one device when the at least one device is in the monitoring region; and localizing, by the at least one device or a server to which the at least one device has transferred to local field distribution, the at least one device by comparing the local field distribution measured with the map.

11. The method of claim 10, wherein the creating the map creates the map by performing a simulation using a field propagation model, the field propagation model being provided with positions, device types and operating profiles of field-emitting components of the field-emitting stationary infrastructure as input data.

12. The method of claim 11, wherein the reference field distribution and the local field distribution are frequency-resolved for each of a plurality of frequency ranges, the plurality of frequency ranges corresponding to different communication methods.

13. The method of claim 10, wherein the reference field distribution and the local field distribution are frequency-resolved for each of a plurality of frequency ranges, the plurality of frequency ranges corresponding to different communication methods.

14. The method of claim 10, further comprising:
obtaining the reference field distribution by measuring a variation in electromagnetic field distribution in the monitoring region over at least a specified time period.

15. The method of claim 14, wherein the obtaining the reference field distribution includes inputting the variation in electromagnetic field distribution to a specified machine learning component.

16. The method of claim 15, wherein the specified machine learning component is a deep-learning based artificial neural network, the deep-learning based artificial neural network being trained to reduce noise in the variation in electromagnetic field distribution over time, the noise being caused by time-varying sources not included in the field-emitting stationary infrastructure.

17. The method of claim 14, wherein the specified time period is at least one day or at least one week.

18. A memory storing a computer program including commands which, upon execution of the computer program by at least one processor, cause the method of claim 10 to be performed by the at least one processor.

19. A non-transitory computer-readable storage medium storing a computer program including commands which, upon execution of the computer program by at least one processor, cause the method of claim 10 to be performed by the at least one processor.

20. An apparatus for integrating to a device to equip the device with a localization functionality, comprising:
at least one processor configured to,
passively measure a local electromagnetic field distribution generated by an infrastructure without any data being exchanged with the infrastructure, and
determine an instantaneous spatial position of the apparatus by comparing the local electromagnetic field distribution with a specified map, the specified map defining a spatially resolved reference field distribution of a local electromagnetic field-generating infrastructure.

21. The apparatus of claim 20, further comprising:
a connection interface, the apparatus being physically connectable to the device via a connection between the connection interface and a corresponding device-based interface.

22. The apparatus of claim 20, wherein the at least one processor is configured to:
passively measure the local electromagnetic field distribution by sending, to the device, first control instructions; and
determine the instantaneous spatial position by sending, to the device, second control instructions.

23. The apparatus of claim 20, wherein the at least one processor is configured to:
emit at least one ping signal and detect response signals from the infrastructure, or cause the device to emit the at least one ping signal and detect the response signals; and
perform a transit-time analysis based on at least one of the response signals or times at which the response signals were detected, and
determine the instantaneous spatial position of the apparatus based on the transit-time analysis and the specified map.

24. The apparatus of claim 20, wherein the at least one processor is configured to determine the instantaneous spatial position based on a signal from a satellite-based positioning system.

* * * * *